United States Patent [19]

Gabler et al.

[11] 4,313,219

[45] Jan. 26, 1982

[54] RECEIVER FOR HIGH FREQUENCY ELECTROMAGNETIC OSCILLATIONS HAVING A FREQUENCY READJUSTMENT

[75] Inventors: Egmont Gabler, Munich; Uwe Lehmann, Dachau, both of Fed. Rep. of Germany

[73] Assignee: Siemens Aktiengesellschaft, Berlin & Munich, Fed. Rep. of Germany

[21] Appl. No.: 129,392

[22] Filed: Mar. 11, 1980

[30] Foreign Application Priority Data

Apr. 2, 1979 [DE] Fed. Rep. of Germany ....... 2913172

[51] Int. Cl.³ .......................... H04B 1/26; H03D 3/02
[52] U.S. Cl. .................................. 455/260; 329/50; 329/122; 331/4; 375/83; 375/97
[58] Field of Search ............... 455/257, 258, 260, 265, 455/208, 209; 329/50, 122, 123; 375/83, 52, 97; 331/4

[56] References Cited

U.S. PATENT DOCUMENTS

| 3,069,625 | 12/1952 | Morita et al. | 455/209 |
| 3,789,302 | 1/1974 | Rearwin et al. | 331/4 |
| 3,878,527 | 4/1975 | Rensin et al. | 455/265 |

*Primary Examiner*—Marc E. Bookbinder
*Attorney, Agent, or Firm*—Hill, Van Santen, Steadman, Chiara & Simpson

[57] ABSTRACT

A receiver for high frequency electromagnetic oscillations, having frequency readjustment with a voltage-control oscillator, includes a phase control loop for regaining the carrier in the signal path of the receiver. The phase control loop comprises a device for recovering the carrier, a phase-locked loop oscillator and phase detector which receives the output signal of the carrier recovery device and the oscillations of the phase-locked loop oscillator as a reference, and a demodulator which receives the modulated input signal and the output of the phase-locked loop oscillator.

4 Claims, 2 Drawing Figures

RECEIVER FOR HIGH FREQUENCY ELECTROMAGNETIC OSCILLATIONS HAVING A FREQUENCY READJUSTMENT

BACKGROUND OF THE INVENTION

1. Field of the Invention

The present invention relates to a receiver for high frequency electromagnetic oscillations having a frequency readjustment which contains a voltage-driven oscillator.

2. Description of the Prior Art

Undesired frequency fluctuations in systems are usually suppressed by means of frequency reverse feedback circuits. For this purpose, a frequency discriminator can be provided in the reverse feedback branch, which frequency discriminator feeds an oscillator, for example the local oscillator of a converter, with its amplified output voltage the oscillator being voltage-controlled and involved in determining the signal frequency.

The frequency readjustment of unmodulated or narrow band signals is relatively noncritical. Particular problems, however, occur given broad band signals such as, for example, pulse shift keying (PSK) signals, in which the entire spectrum must be evaluated in the discriminator because of the missing carrier. With such a system, control errors can occur not only due to unstable frequency discriminators but, rather, also due to non-constant amplitude slopes.

SUMMARY OF THE INVENTION

The object of the present invention is to provide a receiver for high frequency electromagnetic oscillations having a frequency readjustment which occurs in such a manner that control errors are also avoided in the reception of broad band signals.

The above object is achieved, according to the present invention, in that a phase control loop or phase-locked loop (PLL) is provided for recovering the carrier and is inserted in the signal path of the receiver, the loop consisting of a device for recovering the carrier, and providing a rigid phase oscillator (PLL oscillator) and a phase detector to which are supplied the output signal of the carrier recovery unit and the oscillations of the PLL oscillator as a reference signal, and whose phase control output signal is supplied to the frequency control loop. The arrangement further comprises a demodulator which is supplied with the modulated input signal and the oscillations of the PLL oscillator. In practicing the present invention, which is suited for receivers having coherent demodulation, for example PSK receivers, no residual errors arise due to amplitude distortions. In addition, the phase control loop can be directly employed as a frequency discriminator for a frequency control loop, such as an automatic frequency control (AFC) loop.

BRIEF DESCRIPTION OF THE DRAWING

Other objects, features and advantages of the invention, its organization, construction and operation will be best understood from the following detailed description, taken in conjunction with the accompanying drawing, on which.

DESCRIPTION OF THE PREFERRED EMBODIMENTS

Figure 1:
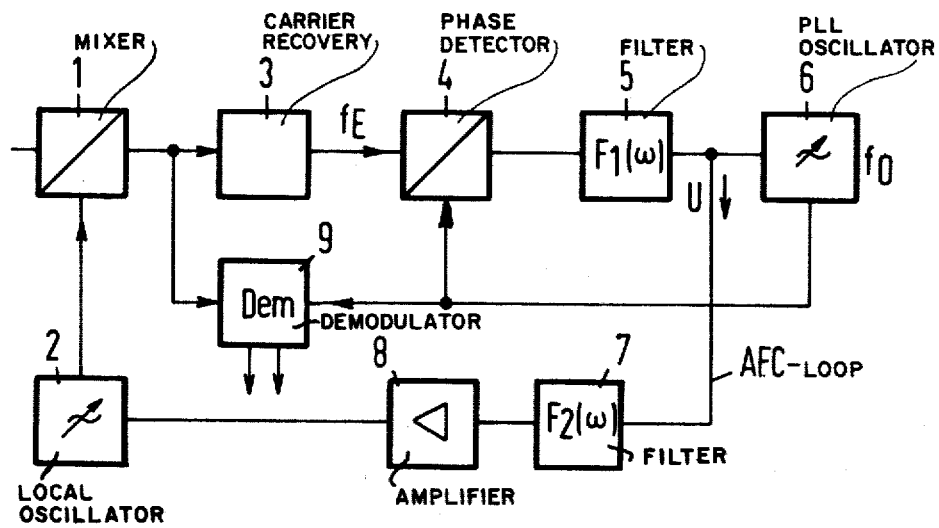
FIG. 1 is a schematic representation of a receiver having a control constructed in accordance with the present invention.

In FIG. 1, a receiver, particularly a PSK receiver, comprises a receiving mixer 1 in which the radio frequency signal is supplied along with the oscillations of a local oscillator 2. A circuit 3 is provided for recovering the carrier, and a phase detector 4 and a filter 5 (PLL loop filter) are inserted, in series, in the signal path of the receiver, that is in the intermediate frequency (IF) level. From the output of the PLL filter 5, a frequency control loop AFC is provided and includes a filter 7 (AFC loop filter) and a controlled-gain amplifier 8 which is connected to the local oscillator 2, which, in turn, is connected to the receiving mixer 1. Further, a PLL oscillator 6 is connected to the output of the filter 5. The PLL oscillator 6 belongs to a phase control loop (PLL loop) and feeds the phase detector 4 and a demodulator 9 which has a second input from the receiving mixer 1. Digital data signals (PSK signals) can be tapped from the output of the demodulator 9 (illustrated by arrows).

In a PSK receiver, the recovered carrier is usually supplied to a phase control loop (PLL loop) in order to limit the phase noise band width with the assistance of the loop filter 5. The signal of the PLL oscillator 6 serves as the output signal, this signal representing a precise image of the recovered carrier within the loop filter band width. The reference gained here is only subsequently supplied to the actual demodulator 9 so that the phase information can be obtained by providing a comparison with the modulated input signal. Thereby, parts such as the phase discriminators of the carrier recovery unit and demodulators can also be identical. In an index state, the oscillator frequency $f_0$ of the PLL oscillator 6 is precisely identical to the input frequency $f_E$ at the input of the phase detector 4 and, therefore, the voltage U at the PLL oscillator 6 is a measure for the input frequency according to the characteristic of the PLL oscillator 6. Thereby, the phase control loop functions as a frequency discriminator and is connected to the frequency control loop (AFC loop). As a condition for stability, there arises the requirement that the band width of the frequency control loop must be significantly smaller than the band width of the phase control loop; accordingly, therefore, the filter 7 having a frequency response $F_2(\omega)$ in the frequency control loop is significantly more narrow band than the filter 5 having the frequency response $F_1(\omega)$ in the phase control loop.

The most favorable working point for the phase control loop is set by means of the frequency control loop, the working point being given a voltage of nearly 0V at the phase discriminator output. This is particularly important in PSK demodulators because of the high loop load due to the operation of recovering the carrier.

Figure 2:
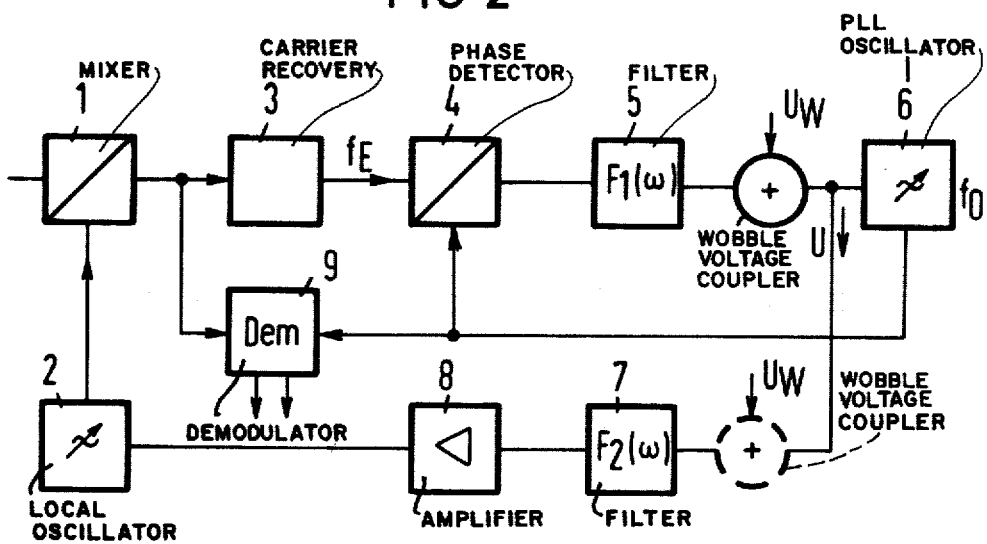
FIG. 2 is a schematic representation corresponding to that of FIG. 1 in which a wobble voltage input coupler is additionally provided.

FIG. 2 illustrates an embodiment of the invention which is basically similar to that of FIG. 1 and in which the identical elements or, respectively, modules are provided with the same reference characters. Means are provided for coupling in an external wobble voltage $U_W$, and the capture of the control loops is undertaken by means of this wobble voltage. Thereby, two possibilities of coupling in the wobble voltage are provided; namely, in the one case, in the phase control loop (the circle in the signal path to which the arrow representing $U_W$ indicates) and, in the other case, in the frequency control loop (a circle indicating, with broken lines, the input of $U_W$). It is essential that both the phase control loop and the frequency control loop be through-driven with the wobble voltage so that the phase control loop can engage first and, subsequently thereto, the frequency control loop can engage.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A receiver for high frequency electromagnetic oscillations, comprising:
   an input for receiving a modulated carrier, including a mixer having a local-oscillator input;
   a phase control loop connected to the output of said mixer;
   a frequency control loop connected between said phase control loop and said local oscillator input of said mixer;
   said phase control loop comprising a carrier recovery circuit connected to said mixer for providing a recovered carrier, a phase detector connected to said carrier recovery circuit, a first filter connected to said phase detector, control loop capture means connected to said first filter and for additionally injecting a separate wobble signal, a first variable frequency oscillator connected to said control loop capture means and controlled by the wobble signal and by the filtered output signal of said phase detector to restore the carrier, and a demodulator connected to said first variable frequency oscillator and to said mixer for demodulating the output signals of said mixer;
   said phase detector connected to said first oscillator to receive the restored carrier for determining the phase between the recovered carrier and the restored carrier; and
   said frequency control loop comprising a second filter connected to said control loop capture means, a controlled gain amplifier connected to said second filter and a second variable frequency oscillator as a local oscillator electrically connected between said controlled gain amplifier and said local oscillator input of said mixer.

2. The receiver of claim 1, wherein the band width of said second filter is significantly smaller than that of said first filter.

3. A receiver for high frequency electromagnetic oscillations, comprising:
   an input for receiving a modulated carrier, including a mixer having a local oscillator input;
   a phase control loop connected to the output of said mixer;
   a frequency control loop connected between said phase control loop and said local oscillator input of said mixer;
   said phase control loop comprising a carrier recovery circuit connected to said mixer for providing a recovered carrier, a phase detector connected to said carrier recovery circuit, a first filter connected to said phase detector, a first variable frequency oscillator connected to said first filter and controlled by the filtered output signal of said phase detector to restore the carrier, and a demodulator connected to said first variable frequency oscillator and to said mixer for demodulating the output signals of said mixer;
   said phase detector connected to said first oscillator, to receive the restored carrier for determining the phase between the recovered carrier and the restored carrier; and
   said frequency control loop comprising control loop capture means connected to the output of said first filter and for additionally injecting a separate wobble signal only into said frequency control loop, a second filter connected to said control loop capture means, a controlled gain amplifier connected to said second filter, and a second variable frequency oscillator as a local oscillator connected between said amplifier and said local oscillator input of said mixer.

4. The receiver of claim 3, wherein the band width of said second filter loop is significantly smaller than that of said first filter.

* * * * *